(12) United States Patent
Kamijo

(10) Patent No.: US 6,531,251 B2
(45) Date of Patent: Mar. 11, 2003

(54) PROXIMITY EFFECT CORRECTION METHODS

(75) Inventor: Koichi Kamijo, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/861,210

(22) Filed: May 17, 2001

(65) Prior Publication Data

US 2002/0006563 A1 Jan. 17, 2002

(30) Foreign Application Priority Data

May 17, 2000 (JP) ........................................ 2000-144401

(51) Int. Cl.⁷ .............................. G03F 9/00; G03C 5/00
(52) U.S. Cl. ............................ 430/5; 430/30; 430/296; 430/942
(58) Field of Search ............................. 430/5, 30, 296, 430/942

(56) References Cited

U.S. PATENT DOCUMENTS

| | | | | |
|---|---|---|---|---|
| 6,117,600 A | * | 9/2000 | Nakasuji | 430/30 |
| 6,277,532 B1 | * | 8/2001 | Yahiro | 430/30 |
| 6,296,976 B1 | * | 10/2001 | Groves et al. | 430/30 |

* cited by examiner

Primary Examiner—Christopher G. Young
(74) Attorney, Agent, or Firm—Klarquist Sparkman LLP

(57) ABSTRACT

Methods are disclosed for calculating exposure energy on a sensitive substrate as realized whenever the substrate is exposed with a reticle pattern. The reticle pattern is divided into regions each defining one or more respective pattern elements. The respective pattern element(s) in the various regions are represented by a respective representative figure having an aspect ratio that reflects the aspect ratio of the pattern elements in the region. The representative figure also has an area equal to the collective area(s) of the respective pattern element(s) in the region, and a centroid located at the centroid of the pattern element(s) in the region. If (1) the direction of one side of the representative figure is in the X-axis direction, (2) the direction of a perpendicular side of the representative figure is in the Y-direction, (3) the sum of the moment of inertia of the actual respective pattern element(s) around an axis parallel to the X-axis and passing through the centroid is $I_x$, and (4) the sum of the moment of inertia of the actual pattern element(s) around an axis parallel to the Y-axis and passing through the centroid is $I_y$, then the ratio between the length of the sides in the X-axis direction and the length of the sides in the Y-axis direction is $(I_y)^{1/2}:(I_x)^{1/2}$.

14 Claims, 10 Drawing Sheets

Actual Pattern Element

Representative Figure

Actual Pattern Element

Representative Figure

PROXIMITY EFFECT CORRECTION METHODS

FIELD OF THE INVENTION

This invention pertains to microlithography (transfer of a pattern, defined by a reticle or mask, to a "sensitive" substrate) using a charged particle beam (e.g, electron beam or ion beam). Microlithography is a key technology used in the manufacture of microelectronic devices such as integrated circuits, displays, thin-film magnetic pickup heads, and micromachines. More specifically, the invention is directed to reducing proximity effects as manifest on the pattern as transferred to the substrate. Even more specifically, the invention pertains to methods for calculating exposure dose at specified regions of the sensitive substrate so as to determine expected respective proximity effects at the specified regions. The invention also pertains to methods for fabricating a reticle, taking into account the results of the proximity effect determinations, that produces less proximity effects during transfer of the reticle pattern to the substrate.

BACKGROUND OF THE INVENTION

Essentially all contemporary methods for fabricating microelectronic devices involve microlithography steps. In the microlithography step, a pattern defined on a reticle or mask is transferred to a "sensitive" substrate such as a semiconductor wafer or the like. The devices are formed on the substrate as respective "chips" that are separated later from each other by "dicing" the wafer. "Sensitive" means that the substrate is coated with a substance, termed a "resist," that can be imprinted with a pattern exposed onto the resist using an energy beam. Exemplary energy beams used for microlithography include light, X-rays, and charged particle beams.

A typical pattern includes a large number of pattern elements or features. As the pattern is exposed onto the substrate, the pattern elements are formed by differential exposure of the substrate, i.e., certain areas of the resist receive a relatively high exposure dose and other areas receive a relatively low exposure dose. After exposure, areas of resist where the exposure dose (cumulative exposure-irradiation energy) exceeds a threshold value are removed (in the case of a positive resist) or left on the substrate (in the case of a negative resist) by developing the resist. To form a pattern element having a respective desired shape profile on the sensitive substrate, it is necessary to calculate whether the exposure dose at the location on the substrate where the pattern element is exposed is higher than a specified threshold. It also is necessary to configure the pattern element on the reticle such that portions of the pattern element corresponding to areas in which the localized exposure dose on the substrate exceeds the threshold nevertheless form the pattern element with the desired shape profile on the substrate.

In charged-particle-beam (CPB) microlithography, proximity effects arise under conditions in which actual localized exposure doses (e.g., exposure doses at single pattern elements) vary according to the nearness, respective profiles, and distribution of neighboring pattern elements, due to scattering of electrons in the resist and from the substrate. More specifically, proximity effects arise due to the scattering of charged particles, incident upon the surface of the sensitive substrate, at small angles that reduce the exposure dose at specified locations. These small-angle scattering events are termed "forward-scattering." Proximity effects also arise due to the scattering of charged particles at wide angles that contribute exposure energy to neighboring unexposed areas. These wide-angle scattering events are termed "back-scattering." Whenever a proximity effect occurs, the exposure dose at a respective location on the sensitive substrate differs from what is expected or desired at the location. As a result, the pattern element that is formed at the location on the substrate usually has a profile that undesirably is different from the desired profile.

Conventional methods for reducing proximity effects generally involve making localized exposure doses closer to desired respective doses. For example, certain methods involve changing and adjusting localized exposure doses by changing beam intensity (dose modulation); others involve changing the profiles of pattern elements as defined on the reticle ("local resizing").

On the substrate, a planar distribution of exposure dose in the resist from irradiation, by a charged particle beam, of a point (x, y) on the surface of the resist can be expressed as the sum of a Gaussian distribution (i.e., a double Gaussian distribution):

$$E(x, y) = \left(\frac{1}{1+\eta}\right)\left(\frac{1}{\pi\sigma_f^2}\right)\exp\left[-\frac{(x^2+y^2)}{\sigma_f^2}\right] + \left(\frac{\eta}{1+\eta}\right)\left(\frac{1}{\pi\sigma_b^2}\right)\exp\left[-\frac{(x^2+y^2)}{\sigma_b^2}\right]$$

The standard-deviation terms, $\sigma_f$ and $\sigma_b$, are broadening terms known as the "forward-scattering diameter" and "back-scattering diameter," respectively; and $\eta$ is a ratio of exposure energy from back-scatter to exposure energy from forward-scatter (i.e., the "back-scatter fraction"). If defocusing in the projection-optical system of the microlithography apparatus is taken into consideration, then the sum of squares of the magnitude of defocusing and the forward-scattering diameter is calculated and substituted as a new $\sigma_f$.

The following discussion refers to mathematical expressions based on back-scattering diameter $\sigma_b$. Expressions based on forward-scattering diameter $\sigma_f$ or optical-system defocusing can be set forth in a similar manner, wherein the back-scattering term is substituted with the forward-scattering term or optical-system-defocusing term.

If a pattern of reference figures (reference elements) is configured as N rectangles each having diagonal apices at the coordinates $(x_{1j}, y_{1j})$, $(x_{2j}, y_{2j})$ (where j=1, 2, 3, ..., N), then the back-scattering energy $E_b(x, y)$ at a location (x, y) can be expressed by integrating the E(x, y) expression above, yielding the following:

$$E_b(x, y) = \sum_j \left[\text{erf}\left(\frac{(x-x_{1j})}{\sigma_b}\right) - \text{erf}\left(\frac{(x-x_{2j})}{\sigma_b}\right)\right] \times \left[\text{erf}\left(\frac{(y-y_{1j})}{\sigma_b}\right) - \text{erf}\left(\frac{(y-y_{2j})}{\sigma_b}\right)\right]$$

wherein "erf" denotes an error function.

This calculation yields a sum corresponding only to the specific number of reference figures to which reference is being made. Consequently, a problem with this calculation is that, as the number N of reference figures increases (with an increase in the density and/or complexity of circuit elements in the pattern), the calculation time increases commensurately.

A conventional method for addressing this problem involves the use of "representative figures," as exemplified in FIGS. 9(A)–9(B). In FIG. 9(A), a pattern region 91 is depicted containing multiple reference figure 93. The region 91 is divided (along dashed lines) into multiple sub-regions 92. Each sub-region 92 is small relative to the back-scatter diameter $\sigma_b$, and serves as the fundamental unit of pattern area on which calculations of local exposure dose are based. By performing exposure-dose calculations based on the contents of specified sub-regions, the number of reference figures used for calculating back-scatter energy is reduced (with a concomitant reduction in calculation time) compared to making calculations based on each individual actual pattern element of the pattern. In FIG. 9(B), a single respective representative figure 94 is derived for each sub-region 92. Each representative figure 94 has the same total surface area and centroid as the respective reference figure 93 in the respective sub-region.

However, in certain instances (e.g., with a pattern for a LSI device) an actual pattern element 103 can have a marked dimensional bias. For example, FIG. 10 depicts a region 102 of a pattern portion 101 (in FIG. 10, the dashed lines denote respective coordinate axes). As shown in the upper portion of FIG. 10, the pattern element 103 extends across the upper portion of the region 102. The pattern element 103 has a horizontally extended, narrow rectangular profile, with a large difference in its length versus its width. A square representative figure 104, as determined using conventional methods, for the pattern element 103 is shown in the lower portion of FIG. 10. With respect to the pattern element 103, if the square representative figure 104 were used for calculating local exposure dose, then the result of the calculation would be quite inaccurate for the particular pattern element 103. On the other hand, if the representative figure 104 could be made horizontally rectangular in profile, then the representative figure would more appropriately represent the pattern element 103 for purposes of calculating exposure dose. However, to represent one or more pattern elements using a rectangular representative figure, it is necessary to determine the appropriate aspect ratio for the rectangle. No currently known methods are available for determining suitable respective aspect ratios for rectangular representative figures or for configuring rectangular representative figures of appropriate respective aspect ratios.

Turning now to FIG. 11, consider a region 110 of a pattern portion 109. The region 110 contains four pattern elements. (The dashed lines denote respective coordinate axes.) In a first example (shown at the top of FIG. 11), the pattern elements 111 are clustered in the center of the region 110. In a second example (shown in the middle of FIG. 11), the pattern elements 112 are separated more distantly from the center of the region 110. If a single representative figure 113 is derived for all four elements 111 or 112 using conventional methods, then the representative figure 113 would be the same in both instances, as shown at the bottom of FIG. 11. In both instances, the representative figure 113 has the same total area and centroid as the group of pattern elements 111 or 112 it represents. Nevertheless, especially for the second example involving the pattern elements 112, the fidelity with which the representative figure 113 represents the actual pattern elements 112 can be poor, which causes substantial inaccuracy in the results of the exposure-dose calculations.

SUMMARY OF THE INVENTION

In view of the shortcomings of conventional methods as summarized above, an object of the invention is to provide methods for accurately calculating exposure-dose (exposure irradiation energy) at specific locations on a sensitive substrate. The methods include determining representative figures in regions of the pattern, wherein each representative figure more accurately reflects the aspect ratio(s) of the respective pattern element(s) in the region and more accurately reflects the distribution of the actual pattern element(s) in the region. The results of these determinations are used in calculations to determine proximity effects, to configure pattern elements as defined on the reticle so as to reduce the proximity effects, and to operate the charged-particle-beam (CPB) microlithography apparatus such that exposure-irradiation doses are adjusted as required to reduce proximity effects.

To such ends, and according to a first aspect of the invention, methods are provided for quantifying an exposure dose received in a region on a surface of the sensitive substrate exposed with a pattern using a charged particle beam. The methods are set forth in the context of a charged-particle-beam microlithography method in which a pattern, defined by a reticle extending in an X-Y plane that is perperpendicular to a Z-axis serving as a microlithographic optical axis, is transferred by a charged particle beam to a sensitive substrate. According to the method, the pattern is divided into multiple pattern regions. (Not all of the region need contain pattern elements.) In a pattern region containing at least one pattern element or portion of a pattern element, respective values of multiple parameters are determined concerning the pattern element(s) and/or portion(s) thereof in the region. (Herein, the term "pattern element" in the context of what is contained within a region can be a respective portion of a pattern element that extends into multiple regions.) The parameters include centroid position, total surface area, and moment of inertia relative to an axis passing through the centroid. For the pattern element(s) in the pattern region, a respective representative figure is calculated having the same values of the characteristic parameters. Using the representative figure instead of the pattern element(s) in the pattern region, the exposure dose (E(x, y)) in the corresponding region on the surface of the substrate is calculated.

More specifically, for regions that contain at least one pattern element or portion of a pattern element, the parameters for the pattern element(s) in the pattern region are the total surface area (S), coordinates ($G_x$, $G_y$) of the centroid, sum ($I_x$) of the moments of inertia of the pattern element(s) relative to an axis parallel to the X-axis and passing through the centroid ($G_x$, $G_y$), and sum ($I_y$) of the moments of inertia of the pattern element(s) relative to an axis parallel to the Y-axis and passing through the centroid ($G_x$, $G_y$). The representative figure has a rectangular profile with diagonal corners at points ($r_{x1}$, $r_{y1}$), ($r_{x2}$, $r_{y2}$); wherein:

$$u = \left( \frac{S}{\sqrt{I_x}\sqrt{I_y}} \right)^{\frac{1}{2}}$$

$$r_{x1} = G_x - \frac{1}{2}\sqrt{I_y}\, u$$

$$r_{x2} = G_x + \frac{1}{2}\sqrt{I_y}\, u$$

$$r_{y1} = G_y - \frac{1}{2}\sqrt{I_x}\, u$$

$$r_{y2} = G_y + \frac{1}{2}\sqrt{I_x}\, u$$

The pattern region can contain a number (j) of respective pattern elements, wherein $j \geq 1$ and $S_j$ is the area of each respective pattern element. In this instance, the centroid of the pattern element(s), regarded collectively in the region, has coordinates $G_{xj}$, $G_{yj}$, each moment of inertia around the axis $x = G_x$ is denoted $I_{xj}$, and each moment of inertia around an axis $y = G_y$ is denoted $I_{yj}$. Under such conditions, $$S = \sum_j S_j$$

-continued $$G_x = \sum_j G_{xj} S_j / S \quad G_y = \sum_j G_{yj} S_j / S$$

$$I_x = \sum_j I_{xj} \quad I_y = \sum_j I_{yj}$$

In the subject method, a factor (f), associated with respective broadening of the pattern element(s) in the pattern region, can be determined. The irradiation intensity of the charged particle beam on the representative figure is f times the irradiation intensity, and the representative figure is configured to have an area of 1/f. In this instance, the parameters for the pattern element(s) in the pattern region are the total surface area (S), coordinates ($G_x$, $G_y$) of the centroid, sum ($I_x$) of the moments of inertia of the pattern element(s) relative to an axis parallel to the X-axis and passing through the centroid ($G_x$, $G_y$), and sum ($I_y$) of the moments of inertia of the pattern element(s) relative to an axis parallel to the Y-axis and passing through the centroid ($G_x$, $G_y$). The representative figure is regarded as having a rectangular profile with diagonal corners at points ($R_{x1}$, $R_{y1}$), ($R_{x2}$, $R_{y2}$). The exposure-irradiation energy of the charged particle beam on the representative figure is a multiple f of a true irradiation energy, wherein:

$$f = \frac{S^2}{12\sqrt{I_x}\sqrt{I_y}}$$

$$U = \frac{2\sqrt{3}}{\sqrt{S}}$$

$$R_{x1} = G_x - \frac{1}{2}\sqrt{I_y}\, U$$

$$R_{x2} = G_x + \frac{1}{2}\sqrt{I_y}\, U$$

$$R_{y1} = G_y - \frac{1}{2}\sqrt{I_x}\, U$$

$$R_{y2} = G_y + \frac{1}{2}\sqrt{I_x}\, U$$

$I_z'$ is a moment of inertia of the representative figure around a line parallel to a Z-axis, perpendicular to the X- and Y-axes, and passing through the centroid ($G_x$, $G_y$). $I_z'$ is expressed as follows:

$$I_z' = \frac{1}{12}[(r_{x2} - r_{x2})^2 + (r_{y2} - r_{y1})^2] S$$

$$= \frac{1}{12}\left[\left(\sqrt{I_x}\, u\right)^2 + \left(\sqrt{I_y}\, u\right)^2\right] S$$

$$= \frac{1}{12}[(I_y u^2 + I_x u^2)] S$$

The representative figure is determined based on a sum $I_z$ of the individual moments of inertia of the pattern element(s) around a line parallel to the Z-axis and passing through the centroid of the representative figure. The sum $I_z$ is expressed as:

$$I_z = \frac{1}{12}[(I_y U^2 + I_x U^2)] S$$

In a situation in which $I_z' = I_z$:

$$U = \left(\frac{I_z}{I_z'}\right)^{\frac{1}{2}} u$$

$$= \left[\frac{(I_x + I_y)}{\frac{1}{12} * (I_x + I_y) u^2 * S}\right]^{\frac{1}{2}} * u$$

$$= \frac{2\sqrt{3}}{\sqrt{S}}$$

The representative figure can be configured to have diagonal corners at the points ($R_{x1}$, $R_{y1}$), ($R_{x2}$, $R_{y2}$), wherein:

$$f = \frac{S^2}{12\sqrt{I_x}\sqrt{I_y}}$$

$$U = \frac{2\sqrt{3}}{\sqrt{S}}$$

$$R_{x1} = G_x - \frac{1}{2}\sqrt{I_y}\, U$$

$$R_{x2} = G_x + \frac{1}{2}\sqrt{I_y}\, U$$

$$R_{y1} = G_y - \frac{1}{2}\sqrt{I_x}\, U$$

$$R_{y2} = G_y + \frac{1}{2}\sqrt{I_x}\, U$$

The foregoing and additional features and advantages of the invention will be more readily apparent from the following detailed description, which proceeds with reference to the accompanying drawings.

BRIEF DESCRIPTION OF THE DRAWINGS

In FIG. 3(A), the upper portion shows the pattern elements in a clustered arrangement, and the lower portion depicts a single representative figure (f=0.3) determined using computational methods according to the invention. In FIG. 3(B), the upper portion shows the pattern elements in a more dispersed arrangement, and the lower portion depicts a single representative figure (f=0.08) determined using computational methods according to the invention.

FIGS. 9(A)–9(B) are schematic plan views of a portion of a pattern, wherein FIG. 9(A) depicts a pattern region divided into multiple sub-regions and containing multiple reference figures, and FIG. 9(B) depicts the same region in which the reference figures have been replaced in each sub-region with a respective representative figure, using conventional computational methods.

DETAILED DESCRIPTION

General Considerations

Figure 1:
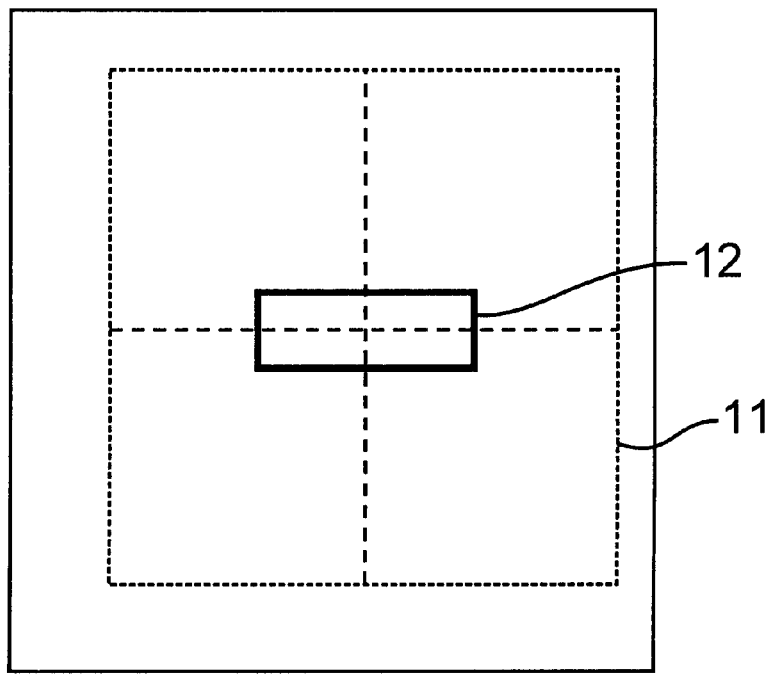
FIG. 1 is a schematic plan view of a region of a pattern, wherein the upper portion of the figure depicts a single rectangular pattern element, and the lower portion of the figure depicts a representative figure 14 (for the two linear pattern elements) determined using a computational method according to the invention, and a representative figure 13 determined using conventional computational methods.
Figure 1:
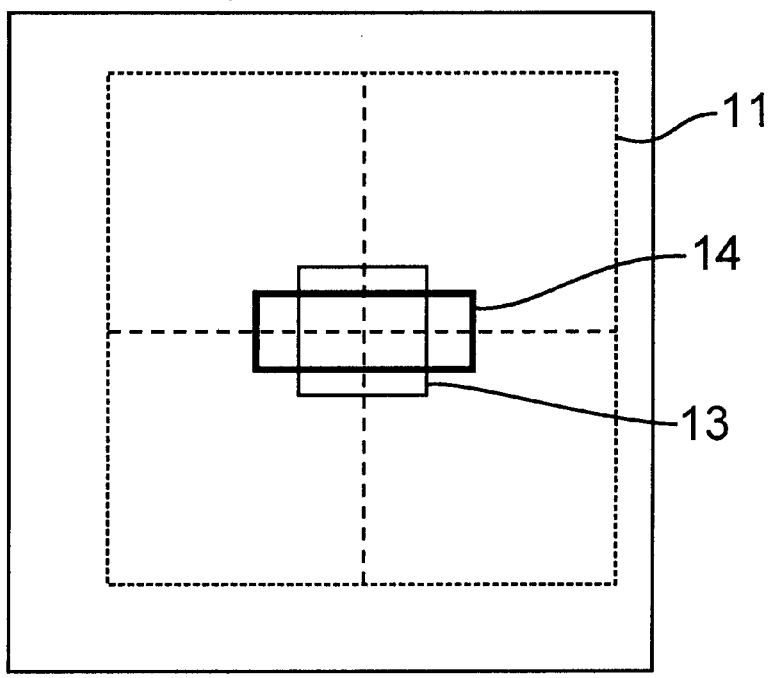

To perform an exposure-dose calculation according to the invention, a pattern to be defined on the reticle is divided into multiple regions that are the fundamental units of pattern area for purposes of calculating local exposure doses of the pattern as projected onto the substrate. At least some of the regions contain respective pattern element(s) that are the subject of the calculations, and calculations are performed for each of multiple regions. (As noted above, the term "pattern element" in the context of what is contained within a region can be a respective portion of a pattern element that extends into multiple regions.) In a selected region, one or more quantitative characteristics of the respective pattern element(s) are defined. The quantitative characteristics are used to configure, in the selected region, at least one respective representative figure having the same respective quantitative characteristics. Based upon the representative figure(s) in the selected region, the exposure-irradiation energy (exposure dose) E at a corresponding point (x, y) on the surface of the sensitive substrate is calculated. This scheme is repeated for each of multiple regions. The time required to perform this calculation is considerably reduced compared to performing the calculations based on the actual pattern elements in each selected region. In addition, calculations performed according to the invention yield exposure dose results that are substantially more accurate than results obtained from calculations performed in a conventional manner.

For a selected region, exemplary quantitative characteristics include the centroid of the respective pattern element(s) and the total surface area of the respective pattern element(s) in the region. Another characteristic, not considered in conventional calculations, is the moment of inertia (relative to an axis passing through the centroid) of the respective pattern element(s) in the region. The moment of inertia provides a determination of the aspect ratio (ratio of width to length) of the respective pattern element(s) in the selected region. The moment of inertia is determined relative to the axes of the relevant height and width of the element(s). By including in the calculations a consideration of the moment of inertia of the pattern element(s), a respective representative figure(s) for the region is derived that yields calculated exposure-dose data for the region that much more closely approximate a local exposure dose realized with actual pattern elements than data based on representative figures derived by conventional computational methods. These accurate data are obtained by methods according to the invention even if the respective length(s) and width(s) of the actual pattern element(s) in the region are substantially different from each other.

From a more mathematical perspective, exemplary quantitative characteristics used in the calculations include the total surface area S of the subject pattern element(s) in the region, the coordinates $(G_x, G_y)$ of the centroid of the pattern element(s), the sum $I_x$ of the moment(s) of inertia of the pattern element(s) relative to an axis parallel to the x-axis and passing through the centroid $(G_x, G_y)$, and the sum $I_y$ of the moment(s) of inertia of the pattern element(s) relative to an axis parallel to the y-axis and passing through the centroid $(G_x, G_y)$. A representative figure for a region is a rectangle having diagonal corners (apices) at the points $(r_{x1}, r_{y1})$, $(r_{x2}, r_{y2})$. The individual coordinates are expressed as follows:

$$r_{x1} = G_x - \frac{1}{2}\sqrt{I_y}\,u$$

$$r_{x2} = G_x + \frac{1}{2}\sqrt{I_y}\,u$$

$$r_{y1} = G_y - \frac{1}{2}\sqrt{I_x}\,u$$

$$r_{y2} = G_y + \frac{1}{2}\sqrt{I_x}\,u$$

wherein:

$$u = \left(\frac{S}{\sqrt{I_x}\,\sqrt{I_y}}\right)^{\frac{1}{2}}$$

For example, in a selected region, consider a representative figure having a rectangular profile and an area equal to the total area of the respective pattern element(s) represented by the representative figure. The representative figure has a centroid located at the centroid of the pattern element(s) in the region. The sides of the representative figure extend parallel to the x-axis and y-axis, respectively, of the pattern. The sum of the moment(s) of inertia of the respective pattern element(s) around an axis parallel to the x-axis and passing through the centroid is $I_x$, and the sum of the moment(s) of inertia of the respective pattern element(s) around an axis parallel to the y-axis and passing through the centroid is $I_y$. With respect to the representative figure, the ratio of the length of the sides extending in the y-axis direction to the length of the sides extending in the x-axis direction is $(I_y)^{1/2}:(I_x)^{1/2}$.

Now consider a selected region having j pattern elements $(j \geq 1)$ each having a respective area $S_j$. The centroid of the pattern elements (regarded collectively in the selected region) has coordinates $(G_{xj}, G_{yj})$. Each moment of inertia around the axis $x=G_x$ is denoted $I_{xj}$, and each moment of inertia around the axis $y=G_y$ is $I_{yj}$. Values of S, $G_x$, $G_y$, $I_x$, and $I_y$ are calculated as follows:

$$S = \sum_j S_j$$

$$G_x = \sum_j G_{xj} S_j / S \quad G_y = \sum_j G_{yj} S_j / S$$

$$I_x = \sum_j I_{xj} \quad I_y = \sum_j I_{yj}$$

The aspect ratio of the representative figure is based on the distribution of actual pattern element(s) in the region. As a result, any difference between the exposure dose (exposure-irradiation energy) determined on the basis of the representative figure and the exposure dose determined on the basis of the actual corresponding pattern element(s) is small compared to results obtained using conventional computational methods.

For example, using computational methods according to the invention, a representative figure 14, shown in the lower portion of FIG. 1, is obtained based on a corresponding actual pattern element 12 shown in the upper portion of FIG. 1. The pattern element 12 is situated in a region 11 that is the fundamental unit of pattern area in which data used for determining the representative figure are obtained. As can be seen, the representative figure 14 has the same size and profile as the pattern element 12. For comparison, a square representative figure 13, determined (based on the pattern element 12) using a conventional computational method, also is shown in the lower portion of FIG. 1. Clearly, the representative figure 14 is a more accurate representation of the actual pattern element 12 than the representative figure 13.

Figure 2:
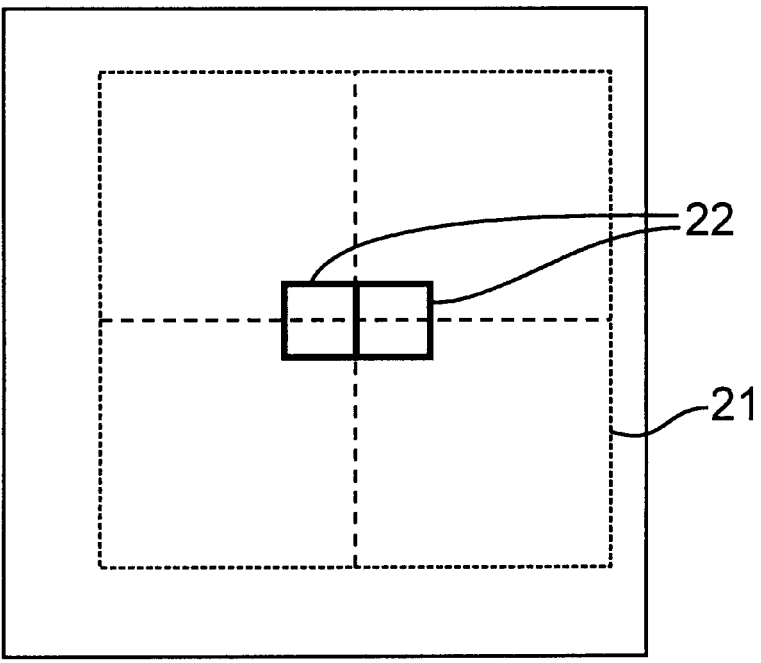
FIG. 2 is a schematic plan view of a region of a pattern, in which the upper portion of the figure depicts two square pattern elements situated side-by-side, and the lower portion of the figure depicts a representative figure 24 determined using a computational method according to the invention, and a representative figure 23 determined using a conventional computational method.
Figure 2:
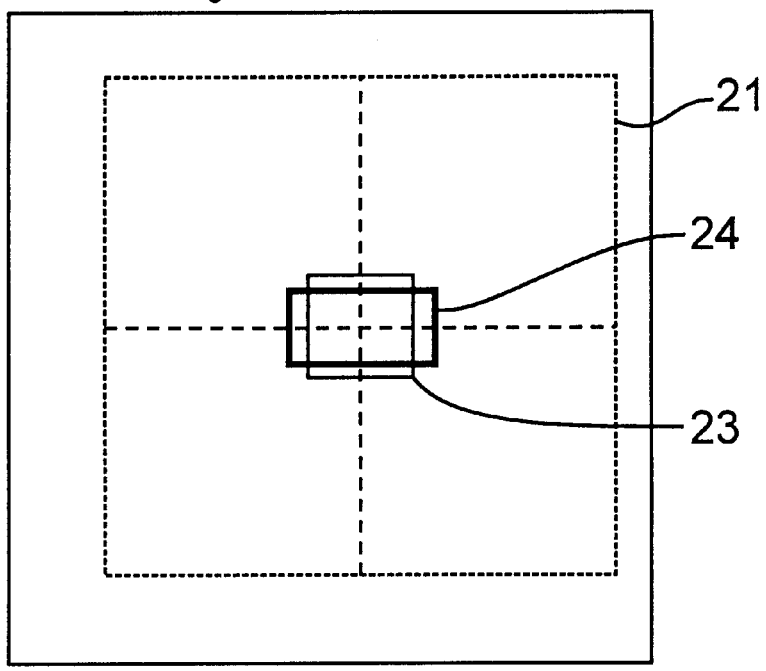

Accurate results also are obtained if the representative figure is based on multiple actual pattern elements. For example, FIG. 2 depicts a situation in which two pattern elements 22 are situated in a region 21. The pattern elements are configured as adjacent rectangles sharing one side, as shown in the upper portion of FIG. 2. A corresponding representative figure 24 determined using computational methods according to the invention is configured as a horizontal rectangle 24 (as shown in the figure). For comparison, a representative figure 23 determined using conventional computational methods is a square. Again, the representative figure 24 is a more accurate representation of the corresponding actual pattern elements than the representative figure 23 obtained by conventional methods.

In a given region of the pattern, the exposure dose E(x, y) is calculated using an irradiation-intensity "filter factor" f that is a function of the broadening of the pattern element(s) as exposed in the region. According to conservation of energy, the greater the broadening, the smaller the factor f. In the region, the area of the representative figure is 1/f. To compensate for this "filtering" effect, the irradiation intensity of the charged particle beam as exposed at the representative figure is f times the "actual" irradiation intensity, wherein the "actual" irradiation intensity is the intensity with which the actual pattern elements are irradiated. Beam intensity can be increased or decreased using any of various conventional methods. For example, if the gun that is used is a thermionic-emission type, beam intensity can be changed by changing the temperature of the thermionic-emission surface. Beam intensity can be changed also by changing an aperture in the illumination-optical system. Thus, in situations in which actual pattern element(s) would produce greater broadening, the area of the respective representative figure is relatively large. Conversely, in situations in which actual pattern element(s) would produce less broadening, the area of the respective representative figure is relatively small. As a result, compared to conventional computational methods, the difference between the exposure dose determined by calculations (according to the invention) based on a representative figure versus the exposure dose determined using actual corresponding pattern element(s) is small.

Consider now a representative figure configured as a rectangle with diagonal corners at the points $(R_{x1}, R_{y1})$, $(R_{x2}, R_{y2})$. On such a representative figure, the irradiation intensity of the charged particle beam yields an exposure-irradiation energy E(x, y) that is a multiple f of the true irradiation intensity of the beam, where:

$$f = \frac{S^2}{12 \sqrt{I_x} \sqrt{I_y}}$$

$$U = \frac{2\sqrt{3}}{\sqrt{S}}$$

$$R_{x1} = G_x - \frac{1}{2} \sqrt{I_y} \, U$$

$$R_{x2} = G_x + \frac{1}{2} \sqrt{I_y} \, U$$

$$R_{y1} = G_y - \frac{1}{2} \sqrt{I_x} \, U$$

$$R_{y2} = G_y + \frac{1}{2} \sqrt{I_x} \, U$$

In the foregoing equations S, ($G_x$, $G_y$), $I_x$, and $I_y$ are as defined above. Thus, the irradiation intensity of the charged particle beam on the representative figure is changed by multiplying the actual irradiation intensity of the beam by f. Meanwhile, the area of the representative figure is a function of 1/f. After obtaining the factor f, the area of the representative figure is corrected using this factor so that the sum of the moment(s) of inertia of the actual pattern element(s) around a line parallel to the z-axis (e.g., optical axis) and passing through the centroid ($G_x$, $G_y$) of the representative figure is equal to the moment of inertia of the representative figure.

The moment of inertia of a representative figure around a line parallel to the z-axis (optical axis) and passing through the centroid ($G_x$, $G_y$) of the representative figure is denoted $I_z'$. $I_z'$ can be expressed as follows:

$$I_z' = \frac{1}{12}[(r_{x2} - r_{x1})^2 + (r_{y2} - r_{y1})^2]S$$

$$= \frac{1}{12}\left[\left(\sqrt{I_x}\, u\right)^2 + \left(\sqrt{I_y}\, u\right)^2\right]S$$

$$= \frac{1}{12}[(I_y u^2 + I_x u^2)]S$$

The sum $I_z$ of the individual moments of inertia of the actual pattern element(s) around a line parallel to the z-axis and passing through the centroid of the corresponding representative figure can be expressed as:

$$I_z = \frac{1}{12}[(I_y U^2 + I_x U^2)]S$$

To make $I_z' = I_z$, the following should apply:

$$U = \left(\frac{I_z}{I_z'}\right)^{\frac{1}{2}} u$$

$$= \left[\frac{(I_x + I_y)}{\frac{1}{12}*(I_x + I_y)u^2 * S}\right]^{\frac{1}{2}} * u$$

$$= \frac{2\sqrt{3}}{\sqrt{S}}$$

As a result, for the representative figure configured as a rectangle having diagonal corners at the points $(R_{x1}, R_{y1})$, $(R_{x2}, R_{y2})$:

$$f = \frac{S^2}{12\sqrt{I_x}\sqrt{I_y}}$$

$$U = \frac{2\sqrt{3}}{\sqrt{S}}$$

$$R_{x1} = G_x - \frac{1}{2}\sqrt{I_y}\,U$$

$$R_{x2} = G_x + \frac{1}{2}\sqrt{I_y}\,U$$

$$R_{y1} = G_y - \frac{1}{2}\sqrt{I_x}\,U$$

$$R_{y2} = G_y + \frac{1}{2}\sqrt{I_x}\,U$$

An irradiation-intensity filter can be used that makes the intensity of irradiation applied to the representative figure constant. Under such conditions, solving the following equation:

$$(\sqrt{I_y}u\ \sqrt{I_x}u) \times 1 = (\sqrt{I_y}U\ \sqrt{I_x}U) \times f$$

results in:

$$f = \frac{S^2}{12\sqrt{I_x}\sqrt{I_y}}$$

Hence, if the region contains one pattern element, the representative figure and the actual pattern element are the same size and have similar profiles. (See FIG. 1.) If the actual pattern elements in a region are configured, for example, as two adjacent rectangles sharing a side along a sub-region boundary, then the representative figure for the two elements is a rectangle integrating these two elements. (See FIG. 2.)

Figure 3A:
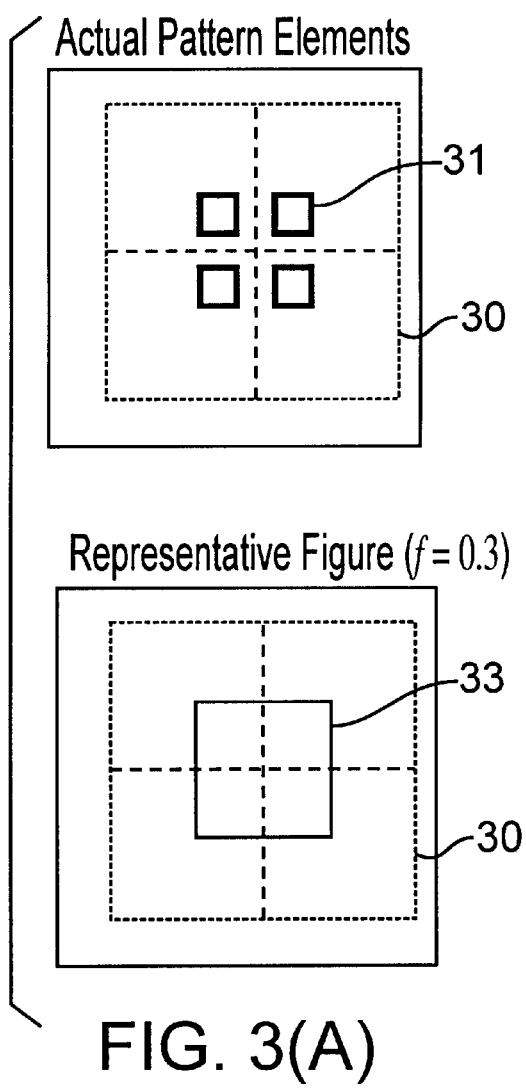
FIGS. 3(A)–3(B) are respective schematic plan views of a region of a pattern containing four pattern elements.
Figure 3B:
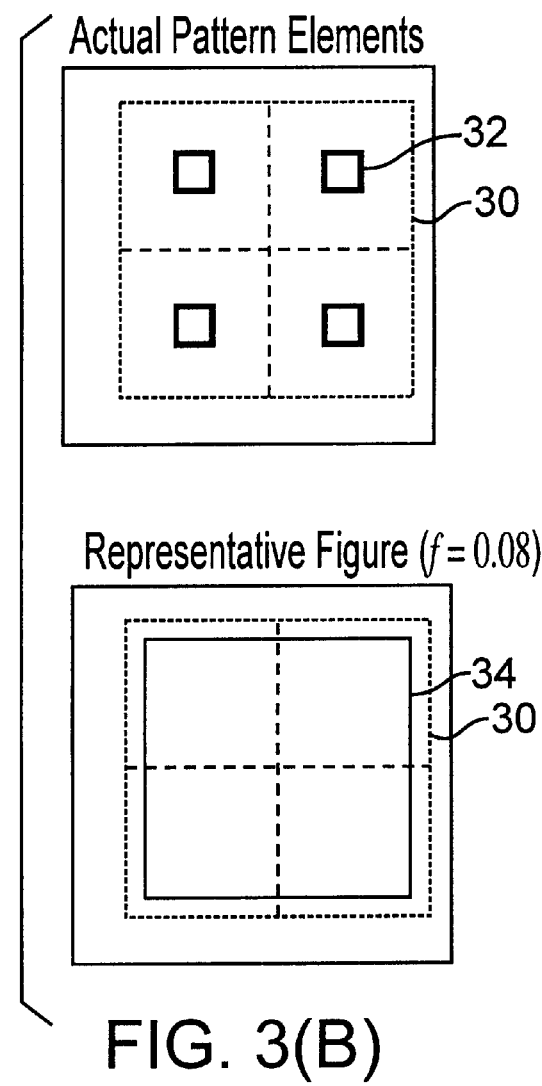

FIGS. 3(A)–3(B) show a situation in which the area of a representative figure in a region 30 can be changed to reflect the distribution of the actual pattern elements. In FIG. 3(A) the pattern elements 31 are distributed over a narrow range in the region 30. In FIG. 3(B), in contrast, the pattern elements 32 are distributed over a relatively wide range in the region 30. Using computational methods according to the invention, these pattern-element arrangements yield the representative figures 33 and 34, respectively. The representative FIG. 33 has f=0.3, and the representative figures 34 has f=0.08.

EXAMPLES AND COMPARATIVE EXAMPLE

Calculations according to the examples were performed assuming that exposure is performed using a 100 keV electron beam. Back-scattering was calculated based on a back-scattering diameter $\sigma_b$ of 30 μm.

Figure 4:
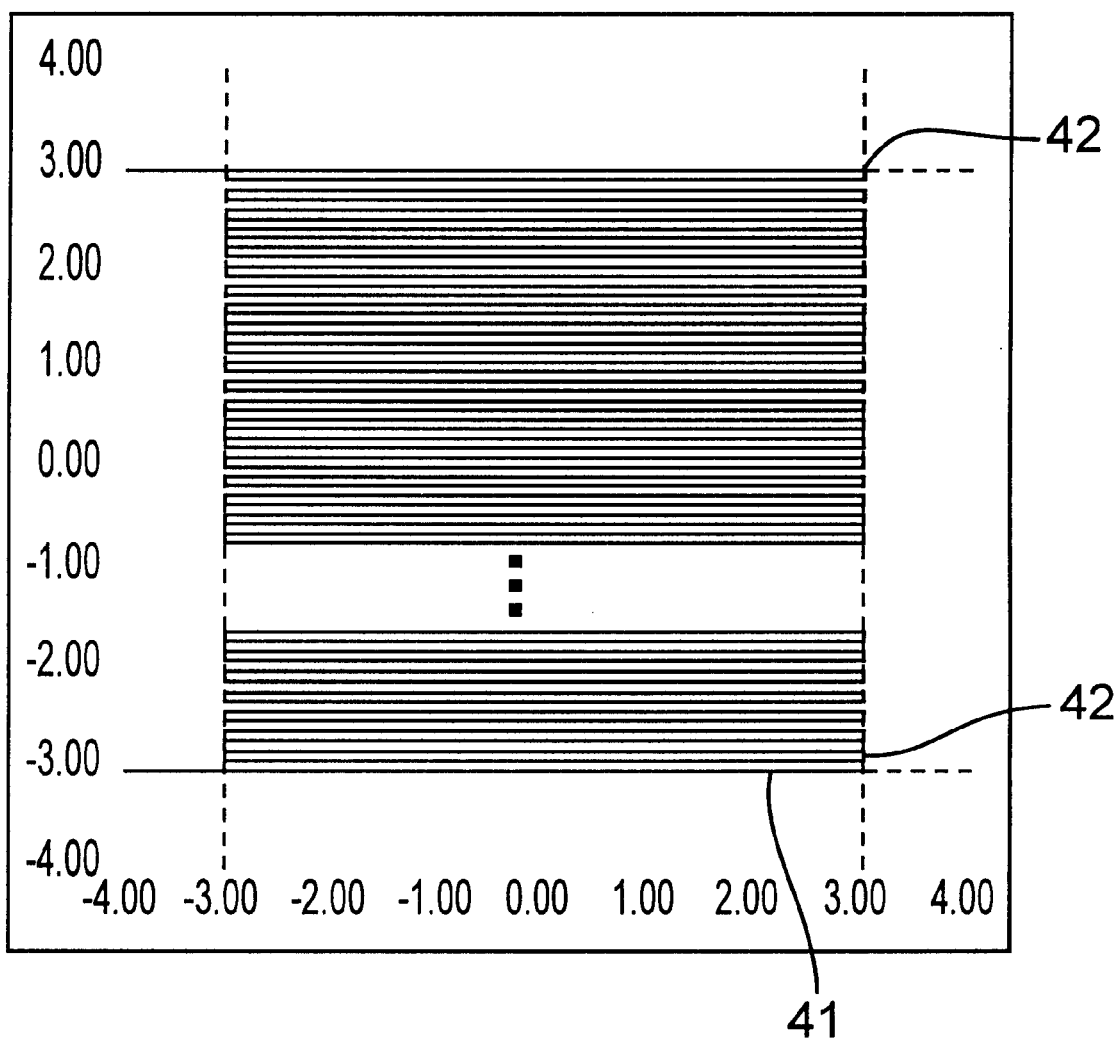
FIG. 4 is a plan view of a region of a pattern containing any of various quantities of horizontally extended LSI linear pattern elements, as discussed in the Examples.

FIG. 4 shows exemplary LSI pattern elements 42, situated in a region 41, used in the calculations. The depicted region 41 is a square having sides each 6 μm long. The center of the region 41 is situated at the origin (0,0 coordinates) of the depicted coordinate system, and the sides of the region 41 extend parallel to the x-axis and y-axis, respectively.

The various examples were based on different respective numbers of linear LSI pattern elements 42 situated side-by-side in the region 41. In the examples in which the region 41 contained multiple actual linear LSI pattern elements 42, the elements 42 were situated parallel to each other and spaced 0.1 μm apart. For each example, the respective calculations involved a determination of exposure energy realized from the actual pattern element 42 as well as exposure energy realized from each of two representative figures.

Also, in the following discussion the coordinate unit is μm. The $j^{th}$ linear element 42 is a rectangular element having diagonal apices at (−3.0, 3.2-0.2j) and (3.0, 3.1-0.2j).

For each example, the respective comparative example is a respective square representative figure (as determined using conventional computational methods) situated in the same part of the region as in the corresponding example.

Figure 5:
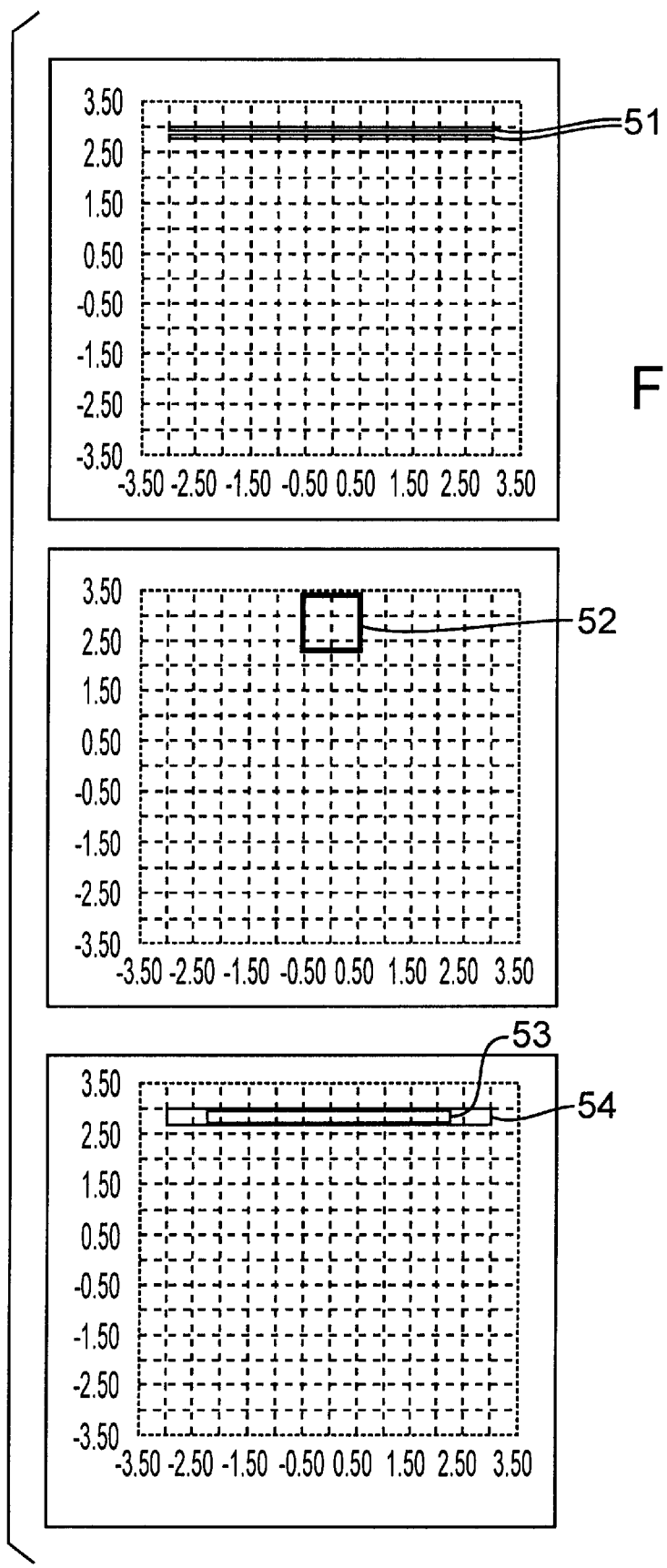
FIG. 5 includes plan views concerning the Examples. The upper portion of the figure depicts a pattern region containing two LSI linear pattern elements. The middle portion of the figure depicts a square representative figure (for the two linear pattern elements) as determined using conventional computational methods. The lower portion of the figure depicts two different representative figures each determined using computational methods according to the invention.

Consider a first example in which the region contains two linear pattern elements 51, as shown in the upper portion of FIG. 5. The area of each pattern element 51 is 6 μm×0.1 μm=0.6 μm², and the total area of the two pattern elements 51 is 1.2 μm². The coordinates of the centroid in this first example are [(0.0, 2.95)×0.6+(0.0, 2.75)×0.6]/1.2=(0.0, 2.85). The representative figure 52 of the respective comparative example has a square profile, with a total area and centroid equal to the total area and centroid, respectively, of the pattern elements 51 in this example. This is shown in the middle portion of FIG. 5. The diagonal apices of the representative figure 52 are (−0.548, 2.302) and (0.548, 3.398), as determined by adding and subtracting the square root of 1.2 to and from, respectively, the centroid coordinates (0.0, 2.85).

A first representative figure 53 according to this example embodiment has a rectangular profile, as shown in the lower portion of FIG. 5. The first representative figure 53 has an area and centroid equal to the total area and centroid, respectively, of the pattern elements 51 in this example. The first representative figure 53 also has a moment $I_x$ (relative to an axis parallel to the x-axis and passing through the centroid) and a moment $I_y$ (relative to an axis parallel to the y-axis and passing through the centroid) that are the same as the respective moments of the corresponding pattern elements 51.

Similar to the representative figure 52 of the corresponding comparative example, the first representative figure 53 has an area of 1.2 μm² and centroid coordinates of (0.0, 2.85). The diagonal apices of the first representative figure 53 are (−2.234, 2.716) and (2.234, 2.984).

A second representative figure 54 according to this example also has a rectangular profile, as shown in the lower portion of FIG. 5. The second representative figure 54 has an area and centroid equal to the total area and centroid, respectively, of the corresponding pattern elements 51. The second representative figure 54 also exhibits a ratio of the moment $I_x$ (relative to an axis parallel to the x-axis and passing through the centroid) and the moment $I_y$ (relative to an axis parallel to the y-axis and passing through the centroid) that is equal to a corresponding ratio collectively exhibited by the actual pattern elements 51. In addition, the area of the second representative figure 54 is modified such that the second representative figure has a moment $I_z'$ (relative to an axis parallel to the z-axis and passing through the centroid) that is equal to a corresponding moment collectively exhibited by the pattern elements 51. The second representative figure 54 has diagonal apices (−3.0, 2.670) and (3.0, 3.030), and has an irradiation-intensity "filter factor" f of 0.54.

To calculate exposure energy realized with a particular example embodiment, the irradiation-intensity filter factor f is multiplied by the intensity of the charged particle beam irradiated on the respective representative figure. The result of such a calculation is used in downstream exposure-energy calculations. In the example involving two pattern elements 51, as described above, the respective values of $E_b(0,0)$ for the actual LSI pattern elements 51, the representative figure 52 of the comparative example, the first representative figure 53, and the second representative figure 54 are $4.19198 \times 10^{-4}$, $4.20506 \times 10^{-4}$, $4.19821 \times 10^{-4}$, and $4.19198 \times 10^{-4}$, respectively.

Similar calculations were performed for other examples in which the number of actual LSI pattern elements 51 was 1, 3, 5, 10, 15, 20, 25, and 30, respectively. In each example first and second representative figures (corresponding to a respective comparative example) were determined. The first and second representative figures were evaluated by calculating the cumulative exposure energy realized from each representative figure and comparing these exposure energy values with the cumulative exposure energy determined from the actual respective LSI pattern elements.

In evaluating cumulative exposure energy obtained with the various examples, two points were selected as evaluation points: the center (0,0) of the region and a corner (3,3) of the region. Table 1 and FIG. 6(A) set forth results of evaluations at the center (0,0) of the sub-region, and Table 2 and FIG. 6(B) set forth results of evaluations at the corner (3,3) of the sub-region.

TABLE 1

| No. Lines | Comp. Ex. | 1st Rep. FIG. | 2nd Rep. FIG. |
|---|---|---|---|
| 1 | 2.91 | 0.00 | 0.00 |
| 2 | 2.83 | 1.32 | $3.55 \times 10^{-9}$ |
| 3 | 2.75 | 1.43 | $9.52 \times 10^{-9}$ |
| 5 | 2.60 | 1.50 | $2.87 \times 10^{-8}$ |
| 10 | 2.34 | 1.63 | $1.20 \times 10^{-7}$ |
| 15 | 2.24 | 1.84 | $2.74 \times 10^{-7}$ |
| 20 | 2.32 | 2.14 | $4.59 \times 10^{-7}$ |
| 25 | 2.57 | 2.52 | $6.34 \times 10^{-7}$ |
| 30 | 2.99 | 2.99 | $9.81 \times 10^{-7}$ |

TABLE 2

| No. Lines | Comp. Ex. | 1st Rep. FIG. | 2nd Rep. FIG. |
|---|---|---|---|
| 1 | 0.316 | 0.00 | 0.00 |
| 2 | 0.306 | 0.146 | $1.74 \times 10^{-6}$ |
| 3 | 0.297 | 0.157 | $1.66 \times 10^{-6}$ |
| 5 | 0.281 | 0.165 | $1.28 \times 10^{-6}$ |
| 10 | 0.254 | 0.181 | $8.56 \times 10^{-7}$ |
| 15 | 0.245 | 0.204 | $7.90 \times 10^{-7}$ |
| 20 | 0.254 | 0.236 | $8.82 \times 10^{-7}$ |
| 25 | 0.282 | 0.277 | $1.07 \times 10^{-6}$ |
| 30 | 0.327 | 0.327 | $1.34 \times 10^{-6}$ |

Figure 6A:
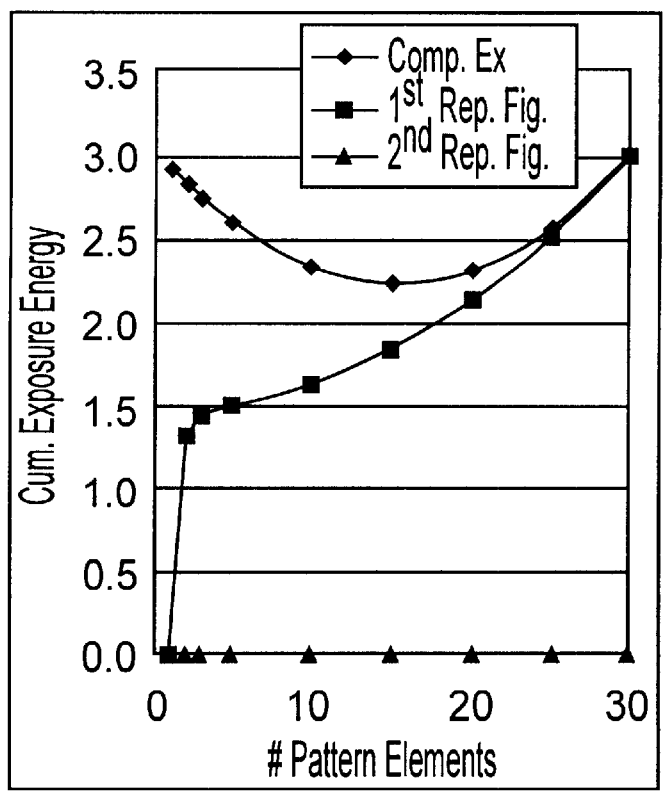
FIGS. 6(A)–6(B) are respective plots of the data in Tables 1 and 2, as discussed in the Examples.
Figure 6B:
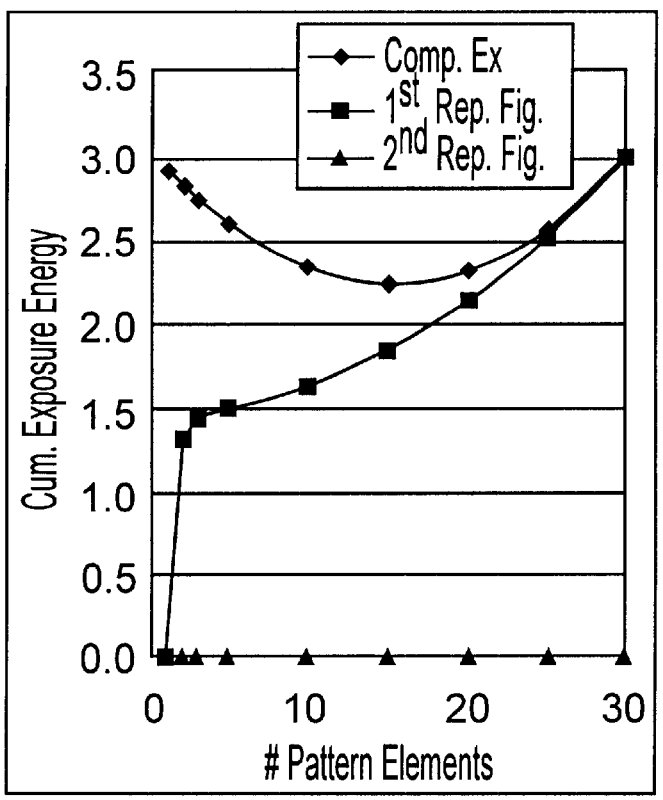

According to the results shown in Tables 1 and 2, and FIGS. 6(a)–6(b), the present invention provides results, of calculations of cumulative exposure energy (exposure dose), having increased accuracy compared to conventional calculations. The increased accuracy is especially evident in the second representative figures determined for each example.

As described above, the methods according to the invention for calculating exposure-irradiation energy are used for calculating proximity effects so as to provide data useful for compensating for and hence reducing the proximity effects. In a first method for reducing proximity effects, the proximity effect is determined and a correction is made to the reticle pattern so that specified exposure-energy doses are applied to specific locations on the sensitive substrate. In a second method for reducing proximity effects, the intensity of the charged particle beam is changed as required during exposure so that, as the beam scans and exposes, a specified exposure dose is applied to specific locations on the sensitive substrate. Either method allows the desired pattern to be formed accurately on the sensitive substrate.

Figure 7:
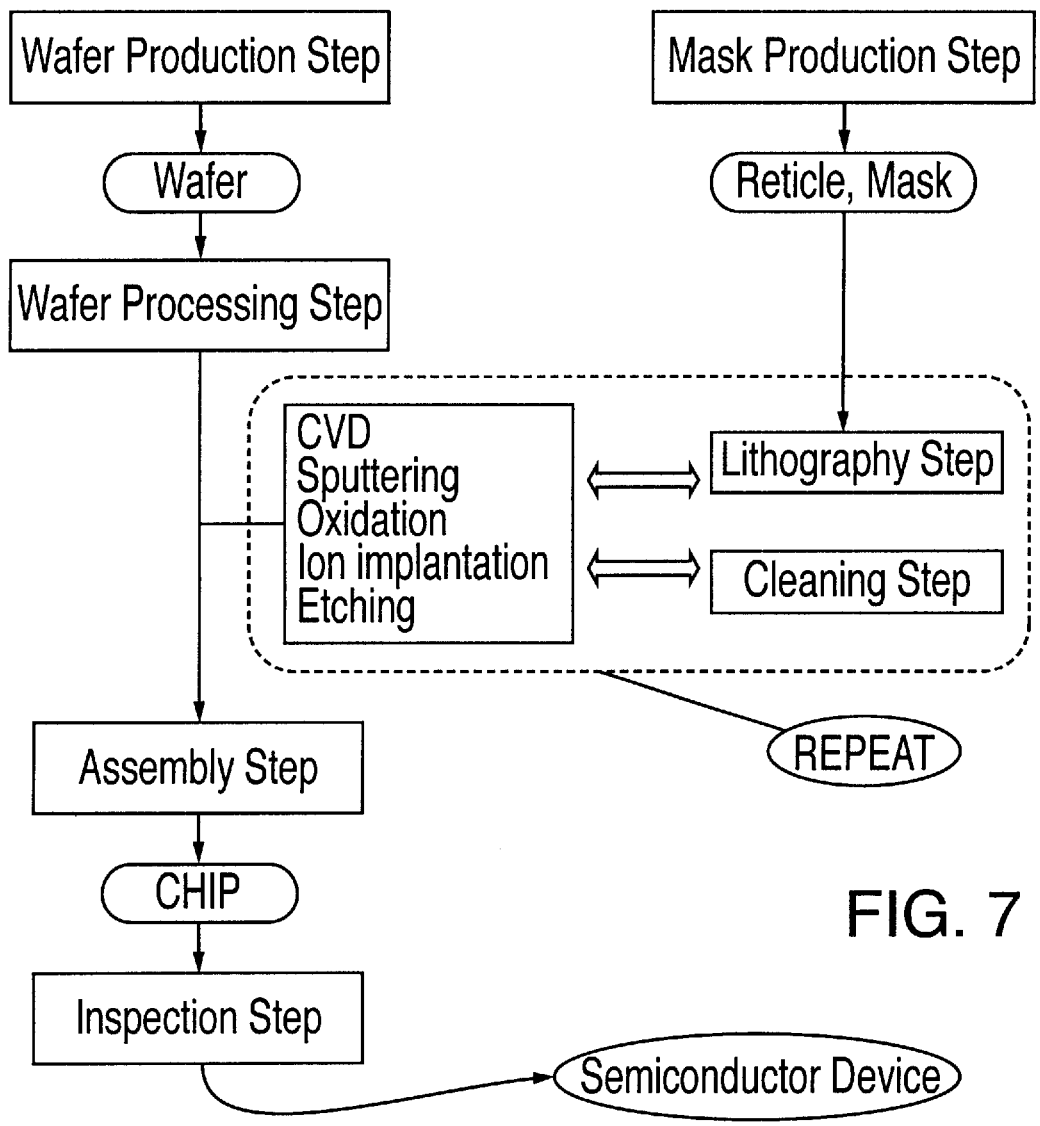
FIG. 7 is a flow chart showing certain aspects of a method for manufacturing a microelectronic device, the method including a microlithography step according to the invention.

FIG. 7 is a flowchart of an exemplary microelectronic-fabrication method in which apparatus and methods according to the invention can be applied readily. The fabrication method generally comprises the main steps of wafer production (wafer manufacturing or preparation), reticle (mask) production or preparation; wafer processing, device (chip) assembly (including dicing of chips and rendering the chips operational), and device (chip) inspection. Each step usually comprises several sub-steps.

Among the main steps, wafer processing is key to achieving the smallest feature sizes (critical dimensions) and best inter-layer registration. In the wafer-processing step, multiple circuit patterns are layered successively atop one another on the wafer, forming multiple chips destined to be memory chips or main processing units (MPUs), for example. The formation of each layer typically involves multiple sub-steps. Usually, many operative microelectronic devices are produced on each wafer.

Typical wafer-processing steps include: (1) thin-film formation (by, e.g., sputtering or CVD) involving formation of a dielectric layer for electrical insulation or a metal layer for connecting wires or electrodes; (2) oxidation step to oxidize the substrate or the thin-film layer previously formed; (3) microlithography to form a resist pattern for selective processing of the thin film or the substrate itself; (4) etching or analogous step (e.g., dry-etching) to etch the thin film or substrate according to the resist pattern; (5) doping as required to implant ions or impurities into the thin film or substrate according to the resist pattern; (6) resist stripping to remove the remaining resist from the wafer; and (7) wafer inspection. Wafer processing is repeated as required (typically many times) to fabricate the desired microelectronic devices on the wafer.

Figure 8:
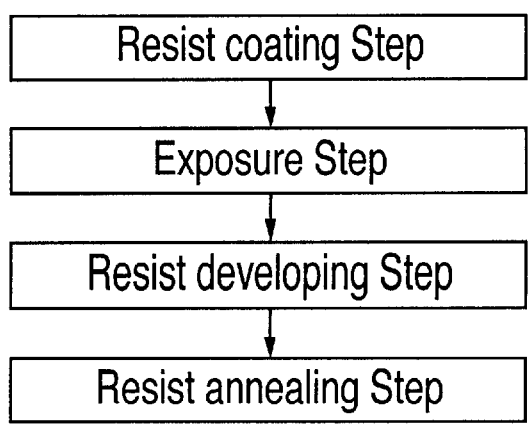
FIG. 8 is a flow chart showing certain aspects of a microlithography process.
Figures 9A, 9B:
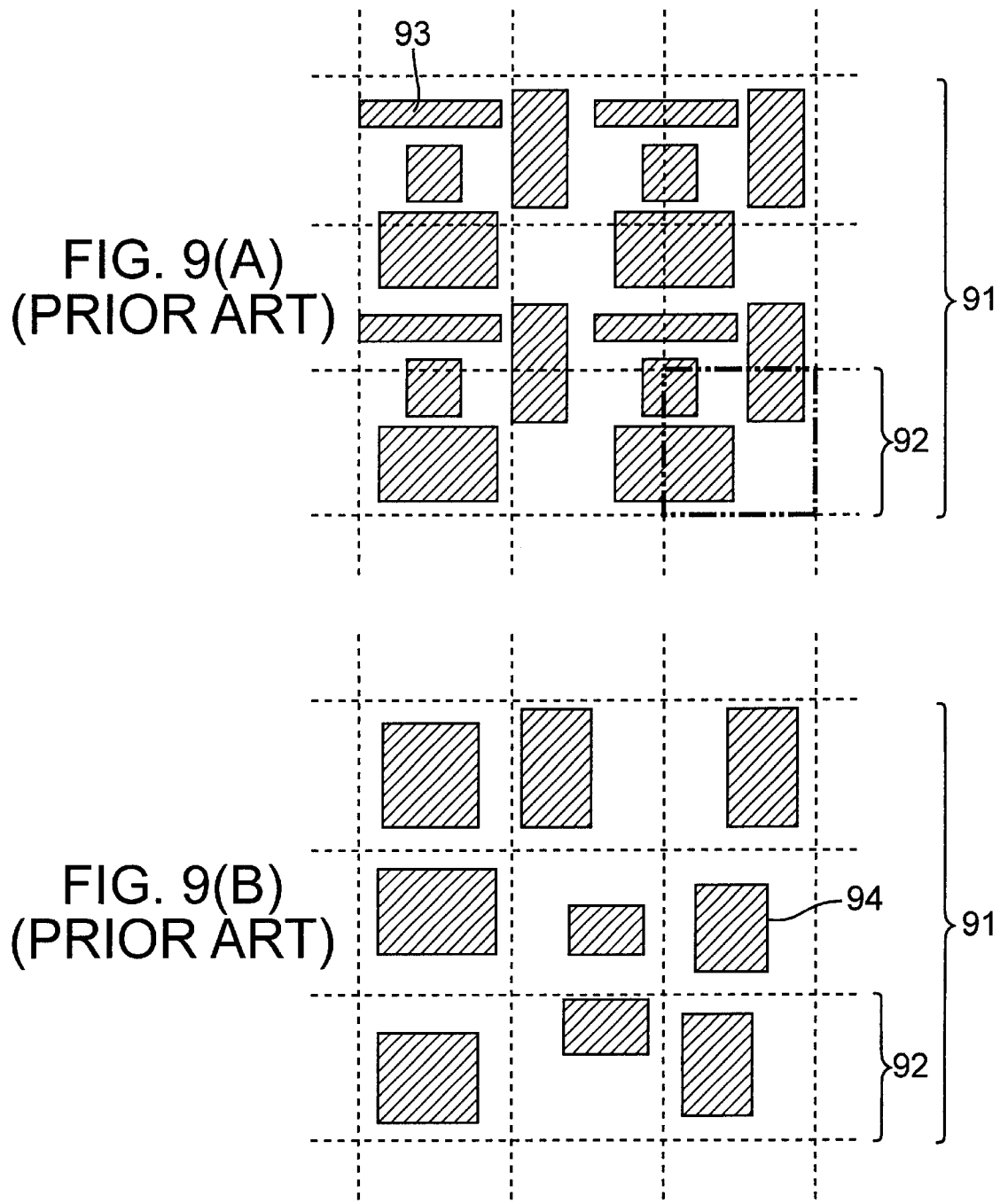
Figure 10:
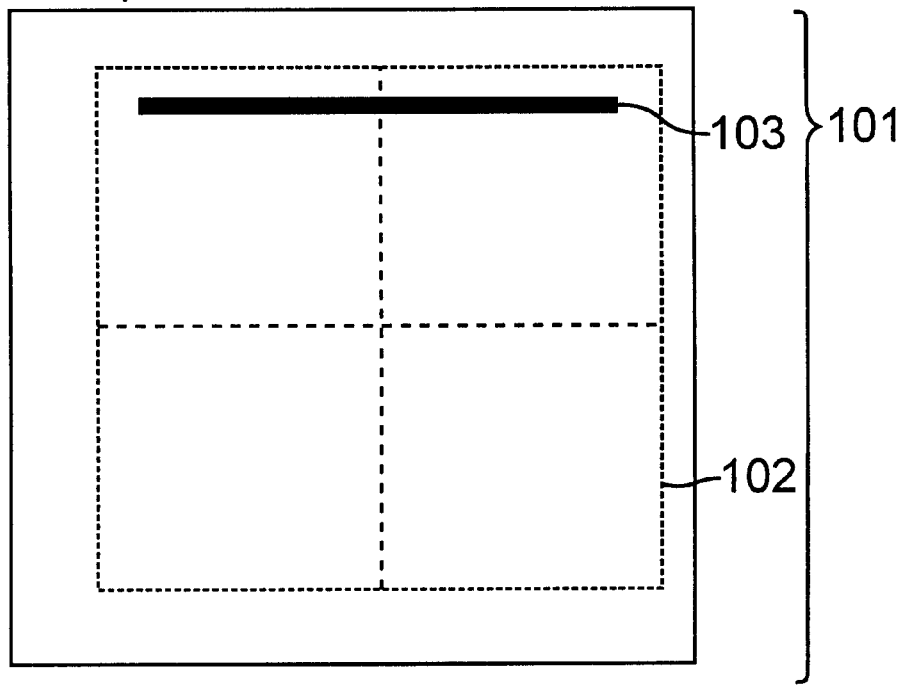
FIG. 10 is a schematic plan view of a horizontally extended (horizontally "biased") pattern element (upper portion of figure) and a corresponding representative figure (lower portion of figure) as determined using conventional computational methods.
Figure 10:
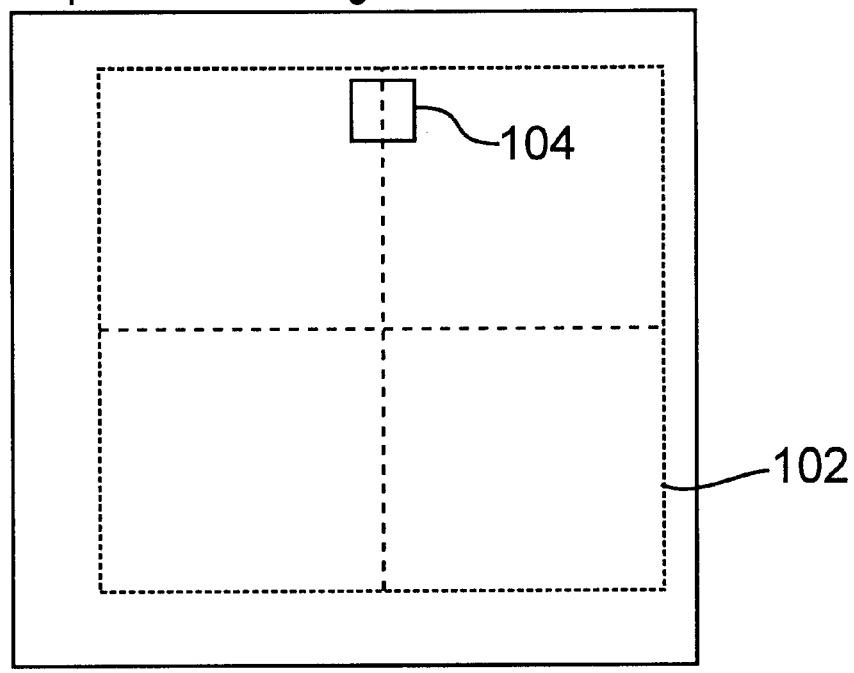
Figure 11:
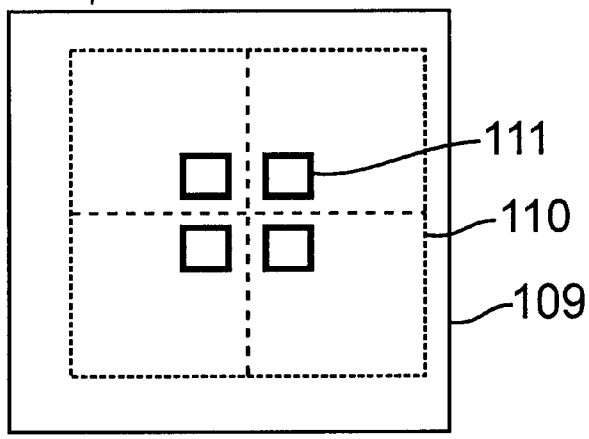
FIG. 11 is a schematic plan view of a pattern region containing four pattern elements. In the upper portion of the figure, the pattern elements are clustered near the center of the region; in the middle portion of the figure, the pattern elements are more dispersed from the center of the region. In the lower portion of the figure, a single representative figure for the four pattern elements is shown, as produced for either arrangement of pattern elements using conventional computational methods.
Figure 11:
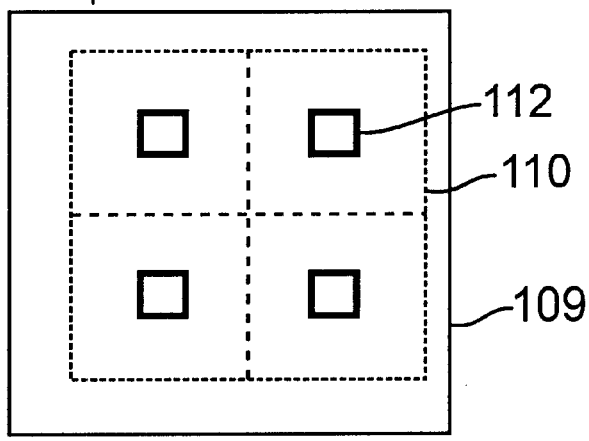
Figure 11:
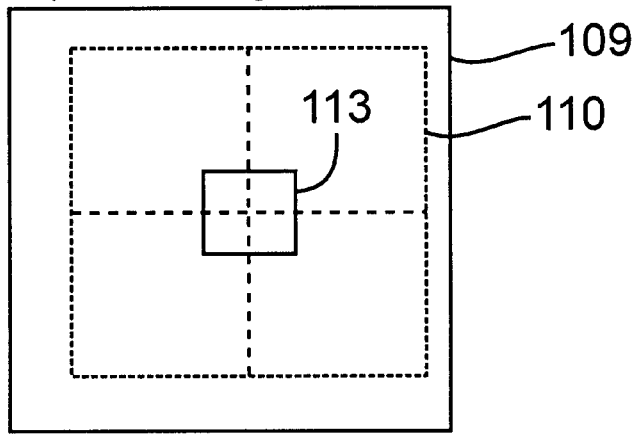

FIG. 8 provides a flowchart of typical steps performed in microlithography, which is a principal step in the wafer processing step shown in FIG. 6. The microlithography step typically includes: (1) resist-application step, wherein a suitable resist is coated on the wafer substrate (which an include a circuit element formed in a previous wafer-processing step); (2) exposure step, to expose the resist with the desired pattern by microlithography; (3) development step, to develop the exposed resist to produce the imprinted image; and (4) optional resist-annealing step, to enhance the durability of and stabilize the resist pattern.

The process steps summarized above are all well known and are not described further herein.

Whereas the invention has been described in connection with a representative embodiment, it will be understood that the invention is not limited to that embodiment. On the contrary, the invention is intended to encompass all modifications, alternatives, and equivalents as may be included within the spirit and scope of the invention, as defined by the appended claims.

What is claimed is:

1. In a charged-particle-beam microlithography method in which a pattern, defined by a reticle extending in an X-Y plane that is perperpendicular to a Z-axis serving as a microlithographic optical axis, is transferred by a charged particle beam to a sensitive substrate, a method for quantifying an exposure dose received in a region on a surface of the sensitive substrate exposed with the pattern, the method comprising:

(a) dividing the pattern into multiple pattern regions;

(b) in a pattern region, determining respective values of multiple parameters concerning at least one pattern element in the region, the parameters including centroid position, total surface area, and moment of inertia relative to an axis passing through the centroid;

(c) for the at least one pattern element in the pattern region, calculating a respective representative figure having the same values of the characteristic parameters; and (d) using the representative figure instead of the at least one pattern element in the pattern region, calculating an exposure dose ($E(x, y)$) in the corresponding region on the surface of the substrate.

2. The method of claim 1, wherein:

the parameters for the at least one pattern element in the pattern region are the total surface area (S), coordinates ($G_x$, $G_y$) of the centroid, sum ($I_x$) of the moments of inertia of the at least one pattern element relative to an axis parallel to the X-axis and passing through the centroid ($G_x$, $G_y$), and sum ($I_y$) of the moments of inertia of the at least one pattern element relative to an axis parallel to the Y-axis and passing through the centroid ($G_x$, $G_y$); and the representative figure has a rectangular profile with diagonal corners at points ($r_{x1}$, $r_{y1}$), ($r_{x2}$, $r_{y2}$); wherein:

$$u = \left( \frac{S}{\sqrt{I_x} \sqrt{I_y}} \right)^{\frac{1}{2}}$$

$$r_{x1} = G_x - \frac{1}{2} \sqrt{I_y}\, u$$

$$r_{x2} = G_x + \frac{1}{2} \sqrt{I_y}\, u$$

$$r_{y1} = G_y - \frac{1}{2} \sqrt{I_x}\, u$$

$$r_{y2} = G_y + \frac{1}{2} \sqrt{I_x}\, u.$$

3. The method of claim 2, wherein:

the pattern region contains (j) respective pattern elements, wherein $j \geq 1$, wherein the $j^{th}$ pattern element has an area $S_j$;

the centroid of the pattern elements, regarded collectively in the region, has coordinates $G_{xj}$, $G_{yj}$;

each moment of inertia around an axis $x=G_x$ is denoted $I_{xj}$;

each moment of inertia around an axis $y=G_y$ is denoted $I_{yj}$; and $$S = \sum_j S_j$$

$$G_x = \sum_j G_{xj} S_j / S \quad G_y = \sum_j G_{yj} S_j / S$$

-continued $$I_x = \sum_j I_{xj} \quad I_y = \sum_j I_{yj}.$$

4. The method of claim 1, wherein:

step (d) comprises determining a factor (f) associated with respective broadening of the at least one pattern element in the pattern region;

the irradiation intensity of the charged particle beam on the representative figure is f times the irradiation intensity; and the representative figure is configured to have an area of $1/f$.

5. The method of claim 4, wherein:

the parameters for the at least one pattern element in the pattern region are the total surface area (S), coordinates ($G_x$, $G_y$) of the centroid, sum ($I_x$) of the moments of inertia of the at least one pattern element relative to an axis parallel to the X-axis and passing through the centroid ($G_x$, $G_y$), and sum ($I_y$) of the moments of inertia of the at least one pattern element relative to an axis parallel to the Y-axis and passing through the centroid ($G_x$, $G_y$);

the representative figure has a rectangular profile with diagonal corners at points ($R_{x1}$, $R_{y1}$), ($R_{x2}$, $R_{y2}$); and an exposure-irradiation energy of the charged particle beam on the representative figure is a multiple f of a true irradiation energy, wherein $$f = \frac{S^2}{12 \sqrt{I_x} \sqrt{I_y}}$$

$$U = \frac{2\sqrt{3}}{\sqrt{S}}$$

$$R_{x1} = G_x - \frac{1}{2} \sqrt{I_y}\, U$$

$$R_{x2} = G_x + \frac{1}{2} \sqrt{I_y}\, U$$

$$R_{y1} = G_y - \frac{1}{2} \sqrt{I_x}\, U$$

$$R_{y2} = G_y + \frac{1}{2} \sqrt{I_x}\, U$$

6. The method of claim 5, wherein:

$I_z'$ is a moment of inertia of the representative figure around a line parallel to a Z-axis, perpendicular to the X- and Y-axes, and passing through the centroid ($G_x$, $G_y$); and $I_z'$ is expressed as follows:

$$I_z' = \frac{1}{12}[(r_{x2} - r_{x1})^2 + (r_{y2} - r_{y1})^2]S$$

$$= \frac{1}{12}\left[\left(\sqrt{I_x}\, u\right)^2 + \left(\sqrt{I_y}\, u\right)^2\right]S$$

$$= \frac{1}{12}[(I_y u^2 + I_x u^2)]S.$$

7. The method of claim 6, wherein:

the representative figure is determined based on a sum $I_z$ of the individual moments of inertia of the pattern elements around a line parallel to the Z-axis and passing through the centroid of the representative figure;

the sum $I_z$ is expressed as:

$$I_z = \frac{1}{12}[(I_y U^2 + I_x U^2)]S.$$

8. The method of claim 7, wherein:

$I_z' = I_z$; and $$U = \left(\frac{I_z}{I_z'}\right)^{\frac{1}{2}} u$$

$$= \left(\frac{(I_x + I_y)}{\frac{1}{12} * (I_x + I_y) u^2 * S}\right)^{\frac{1}{2}} * u$$

$$= \frac{2\sqrt{3}}{\sqrt{S}}.$$

9. The method of claim 8, wherein:

the representative figure is configured to have diagonal corners at the points $(R_{x1}, R_{y1})$, $(R_{x2}, R_{y2})$; and $$f = \frac{S^2}{12\sqrt{I_x}\sqrt{I_y}}$$

$$U = \frac{2\sqrt{3}}{\sqrt{S}}$$

$$R_{x1} = G_x - \frac{1}{2}\sqrt{I_y}\, U$$

$$R_{x2} = G_x + \frac{1}{2}\sqrt{I_y}\, U$$

$$R_{y1} = G_y - \frac{1}{2}\sqrt{I_x}\, U$$

$$R_{y2} = G_y + \frac{1}{2}\sqrt{I_x}\, U.$$

10. A method for calculating a proximity effect for a charged-particle-beam microlithography apparatus employing a charged particle beam to expose and transfer a pattern, defined by a reticle, onto a sensitive substrate, comprising the method for calculating a quantity of exposure energy at a surface of the sensitive substrate as recited in claim 1.

11. A method for designing a reticle, comprising:

providing a reticle substrate;

for pattern elements to be defined on the reticle substrate, calculating proximity effects as recited in claim 10; and configuring the pattern elements on the reticle so as to produce, when the pattern elements are projection-transferred to a sensitive substrate, reduced proximity effects.

12. A charged-particle-beam microlithography apparatus, configured to adjust an irradiation amount of the charged particle beam using the proximity effect compensation method recited in claim 10.

13. A method for manufacturing a microelectronic device, comprising a microlithography step performed using a charged-particle-beam microlithography apparatus as recited in claim 12.

14. A method for performing charged-particle-beam microlithography, comprising:

providing a reticle designed as recited in claim 11;

illuminating the reticle using a charged-particle illumination beam; and projecting the pattern onto a sensitive substrate.

\* \* \* \* \*

UNITED STATES PATENT AND TRADEMARK OFFICE
CERTIFICATE OF CORRECTION

PATENT NO. : 6,531,251 B2
DATED : March 11, 2003
INVENTOR(S) : Koichi Kamijo

It is certified that error appears in the above-identified patent and that said Letters Patent is hereby corrected as shown below:

Column 2,
Lines 20-23, should be -- $E(x,y) = \left(\frac{1}{1+\eta}\right)\left(\frac{1}{\pi\sigma_f^2}\right)\exp\left[-\frac{(x^2+y^2)}{\sigma_f^2}\right] + \left(\frac{\eta}{1+\eta}\right)\left(\frac{1}{\pi\sigma_b^2}\right)\exp\left[-\frac{(x^2+y^2)}{\sigma_b^2}\right]$ --

Lines 48-52, should be -- $E_b(x,y) = \sum_j \left[erf\left(\frac{(x-x_{1j})}{\sigma_b}\right) - erf\left(\frac{(x-x_{2j})}{\sigma_b}\right)\right] \times \left[erf\left(\frac{(y-y_{1j})}{\sigma_b}\right) - erf\left(\frac{(y-y_{2j})}{\sigma_b}\right)\right]$ --

Column 3,
Line 11 "figure" should be -- figure(s) --.

Column 5,
Lines 28-45, should be --
$$f = \frac{S^2}{12\sqrt{I_x}\sqrt{I_y}}$$
$$U = \frac{2\sqrt{3}}{\sqrt{S}}$$
$$R_{x1} = G_x - \frac{1}{2}\sqrt{I_y}U$$
$$R_{x2} = G_x + \frac{1}{2}\sqrt{I_y}U$$
$$R_{y1} = G_y - \frac{1}{2}\sqrt{I_x}U$$
$$R_{y2} = G_y + \frac{1}{2}\sqrt{I_x}U$$
--

Lines 55-59, should be --
$$I_z' = \frac{1}{12}\left[(r_{x2}-r_{x1})^2 + (r_{y2}-r_{y1})^2\right]S$$
$$= \frac{1}{12}\left[(\sqrt{I_y}u)^2 + (\sqrt{I_x}u)^2\right]S$$
$$= \frac{1}{12}\left[(I_y u^2 + I_x u^2)\right]S$$
--

Column 10,
Lines 15-32, should be --
$$f = \frac{S^2}{12\sqrt{I_x}\sqrt{I_y}}$$
$$U = \frac{2\sqrt{3}}{\sqrt{S}}$$
$$R_{x1} = G_x - \frac{1}{2}\sqrt{I_y}U$$
$$R_{x2} = G_x + \frac{1}{2}\sqrt{I_y}U$$
$$R_{y1} = G_y - \frac{1}{2}\sqrt{I_x}U$$
$$R_{y2} = G_y + \frac{1}{2}\sqrt{I_x}U$$
--

UNITED STATES PATENT AND TRADEMARK OFFICE
CERTIFICATE OF CORRECTION

PATENT NO. : 6,531,251 B2
DATED : March 11, 2003
INVENTOR(S) : Koichi Kamijo

It is certified that error appears in the above-identified patent and that said Letters Patent is hereby corrected as shown below:

<u>Column 11,</u>
Lines 18-35, should be $$f = \frac{S^2}{12\sqrt{I_x}\sqrt{I_y}}$$

$$U = \frac{2\sqrt{3}}{\sqrt{S}}$$

$$R_{x1} = G_x - \frac{1}{2}\sqrt{I_y}U$$

$$R_{x2} = G_x + \frac{1}{2}\sqrt{I_y}U$$

$$R_{y1} = G_y - \frac{1}{2}\sqrt{I_x}U$$

$$R_{y2} = G_y + \frac{1}{2}\sqrt{I_x}U$$

<u>Column 15,</u>
Lines 37-48, should be $$u = \left(\frac{S}{\sqrt{I_x}\sqrt{I_y}}\right)^{\frac{1}{2}}$$

$$r_{x1} = G_x - \frac{1}{2}\sqrt{I_y}u$$

$$r_{x2} = G_x + \frac{1}{2}\sqrt{I_y}u$$

$$r_{y1} = G_y - \frac{1}{2}\sqrt{I_x}u$$

$$r_{y2} = G_y + \frac{1}{2}\sqrt{I_x}u$$

<u>Column 16,</u>
Lines 35-51, should be $$f = \frac{S^2}{12\sqrt{I_x}\sqrt{I_y}}$$

$$U = \frac{2\sqrt{3}}{\sqrt{S}}$$

$$R_{x1} = G_x - \frac{1}{2}\sqrt{I_y}U$$

$$R_{x2} = G_x + \frac{1}{2}\sqrt{I_y}U$$

$$R_{y1} = G_y - \frac{1}{2}\sqrt{I_x}U$$

$$R_{y2} = G_y + \frac{1}{2}\sqrt{I_x}U$$

Line 65, should be $$= \frac{1}{12}\left[\left(\sqrt{I_x}u\right)^2 + \left(\sqrt{I_y}u\right)^2\right]S$$

UNITED STATES PATENT AND TRADEMARK OFFICE
CERTIFICATE OF CORRECTION

PATENT NO. : 6,531,251 B2
DATED : March 11, 2003
INVENTOR(S) : Koichi Kamijo

It is certified that error appears in the above-identified patent and that said Letters Patent is hereby corrected as shown below:

Column 17,
Line 20, delete "$I_z = I_{z;\ and}$".

Lines 26-36, should be $$U = \left(\frac{I_z}{I_z'}\right)^{\frac{1}{2}} u$$

$$= \left[\frac{(I_x + I_y)}{\frac{1}{12}*(I_x + I_y)u^2 * S}\right]^{\frac{1}{2}} * u$$

Column 17, line 44 through Column 18, line 15,
Should be $$f = \frac{S^2}{12\sqrt{I_x}\sqrt{I_y}}$$

$$U = \frac{2\sqrt{3}}{\sqrt{S}}$$

$$R_{x1} = G_x - \frac{1}{2}\sqrt{I_y}U$$

$$R_{x2} = G_x + \frac{1}{2}\sqrt{I_y}U$$

$$R_{y1} = G_y - \frac{1}{2}\sqrt{I_x}U$$

$$R_{y2} = G_y + \frac{1}{2}\sqrt{I_x}U$$

Signed and Sealed this

Seventeenth Day of August, 2004

JON W. DUDAS
*Acting Director of the United States Patent and Trademark Office*